United States Patent [19]

Ahne

[11] Patent Number: 4,801,681

[45] Date of Patent: Jan. 31, 1989

[54] METHOD FOR THE MANUFACTURE OF POLYIMIDAZOLE AND POLYIMIDAZO-PYRROLONE PRECURSORS FROM TETRA CARBOXYLIC ACID MOIETY REACTANT

[75] Inventor: Hellmut Ahne, Röttenbach, Fed. Rep. of Germany

[73] Assignee: Siemens Aktiengesellschaft, Munich, Fed. Rep. of Germany

[21] Appl. No.: 21,152

[22] Filed: Mar. 3, 1987

Related U.S. Application Data

[63] Continuation of Ser. No. 716,675, Mar. 27, 1985, Pat. No. 4,656,244.

[30] Foreign Application Priority Data

Mar. 29, 1984 [DE] Fed. Rep. of Germany ..... 34117067

[51] Int. Cl.$^4$ .............................................. C08G 73/18
[52] U.S. Cl. .................. 528/336; 428/411.1; 428/473.5; 528/335; 528/341; 528/342; 528/345; 528/351; 528/353
[58] Field of Search ............... 528/336, 335, 341, 342, 528/345, 353, 351; 428/411.1, 473.5

[56] References Cited

U.S. PATENT DOCUMENTS 4,656,244 4/1987 Ahne ................................. 528/336

Primary Examiner—Harold D. Anderson
Attorney, Agent, or Firm—Kenyon & Kenyon

[57] ABSTRACT

Oligomeric and/or polymeric radiation-reactive polyimidazole and polyimidazo pyrrolone precursors which are soluble in organic solvents, can be prepared with high purity, i.e., especially without chloride, in a simple manner if an aromatic and/or heterocyclic tetraamino compound is reacted in the presence of a carbodiimide, with an olefinically unsaturated monocarboxylic acid and a dicarboxylic acid, or with an olefinically unsaturated monocarboxylic acid and an aromatic and/or heterocyclic tetracarboxylic acid dianhydride, or with an olefinically unsaturated tetracarboxylic acid diester, in the form of an addition product of the tetracarboxylic acid dianhydride and an olefinically unsaturated alcohol. The radiation-reactive precursors prepared in this manner are suitable, for instance, for the manufacture of highly heat-resistant relief structures.

5 Claims, No Drawings

METHOD FOR THE MANUFACTURE OF POLYIMIDAZOLE AND POLYIMIDAZO-PYRROLONE PRECURSORS FROM TETRA CARBOXYLIC ACID MOIETY REACTANT

This is a division of application Ser. No. 716,675 filed Mar. 27, 1985, now U.S. Pat. No. 4,656,244.

BACKGROUND OF THE INVENTION

The invention relates to a method for the manufacture of oligomeric and/or polymeric radiation-reactive precursors of polyimidazoles and polyimidazo-pyrrolones, as well as to the use of these radiation-reactive precursors.

Polyimidazoles are characterized by extraordinary chemical resistance to acids and bases, and it is known that polyimidazo-pyrrolones exhibit nearly twice the resistance to hard radiation as compared to polyimides. These special properties of the foregoing polymer types therefore appear useful in the area of generating fine structures. For this purpose, however, it is necessary that soluble radiation-reactive precursors of these polymers are available, from which fine structures can be generated by means of photolithographic processes.

Radiation-reactive polyimidazole and polyimidazo-pyrrolone precursors are already known (U.S. Pat. No. 4,397,999), and specifically in the form of addition products of olefinically unsaturated monoepoxides on amino group-containing polycondensation products of aromatic and/or heterocyclic tetraamino compounds with dicarboxylic-acid chlorides or esters (polyimidazole precursors) or on amino group-containing polyaddition products of the tetraamino compounds and tetracarboxylic acid dianhydrides (polyimidazo pyrrolone precursors).

The foregoing manufacturing method is not entirely satisfactory, however. Thus, purification processes are required if acid chlorides are used. In addition, the reaction of the amino group-containing polycondensation or polyaddition products requires an excess of unsaturated monoepoxide, which can occasionally lead to difficulties in the purification of the reaction products; in addition, longer reaction times may be necessary. Furthermore, the polymer precursors obtained have limited photosensitivity, obviously due to incomplete reaction and because of secondary reactions.

It is an object of the invention, therefore, to develop a method for the simple preparation of polyimidazole and polyimidazo-pyrrolone precursors which are soluble in organic solvents, are at the same time radiation-reactive and are of high purity, i.e., are in particular free of chloride.

SUMMARY OF THE INVENTION

These and other objects are achieved according to the method of the present invention, in which an aromatic and/or heterocyclic tetraamino compound is reacted, in the presence of a carbodiimide, with an olefinically unsaturated monocarboxylic acid and a dicarboxylic acid, or with an olefinically unsaturated monocarboxylic acid and an aromatic and/or heterocyclic tetracarboxylic acid dianhydride, or with an olefinically unsaturated tetracarboxylic acid diester in the form of an addition product from the tetracarboxylic acid dianhydride and an olefinically unsaturated alcohol.

DETAILED DESCRIPTION OF THE INVENTION

Within the scope of the present invention, "tetracarboxylic acid dianhydride" is understood to mean compounds which have at least two acid anhydride groupings. Also, different tetraamino compounds as well as different monocarboxylic acids, dicarboxylic acids and tetracarboxylic acid dianhydrides or diesters can be used in mixture in the method according to the invention.

According to the method of the invention, polyimidazole and polyimidazo-pyrrolone precursors can be prepared in a simple manner, whereby more uniform reaction products are generated. As compared with the known polyimidazole and polyimidazo-pyrrolone precursors, the precursors prepared by the method according to the invention exhibit a larger share of photosensitive groups, which is due to a more complete reduction, and are consequently more radiation-reactive.

The method according to the invention is generally carried out in a solvent. In the (poly)condensation reactions, in which carbodiimide is used, the urea which is produced from the carbodiimide, will precipitate at room temperature. As a result, high-purity, essentially chloride-free solutions of the radiation-reactive precursors are obtained since the precursors are highly soluble in organic solvents. The solutions of the precursors can be used directly without supplemental purification after the urea derivative, which is produced in very pure form as a secondary product, is separated. This processing step provides a great economy to the method. However, one can also proceed in such a manner that the precursors are isolated by precipitation as solid resin. With either alternative, however, homogeneous layers of precursor can be prepared from solutions of the precursors which may have a wide range of thicknesses and which can, for instance, be hardened by UV irridation.

Polyimidazole precursors can generally be manufactured by either of two sequences. In the first, the tetraamino compound is reacted with the olefinically unsaturated monocarboxylic acid and the condensation intermediate formed in this process is then polycondensed with the dicarboxylic acid. In the second, the tetraamino compound is first reacted with the dicarboxylic acid and then the resulting polycondensation intermediate is condensed with the olefinically unsaturated monocarboxylic acid. Each of these reactions is carried out in the presence of carbodiimide.

Polyimidazo pyrrolone precursors can also be produced by either of two sequences. In the first, the tetraamino compound is reacted, in the presence of carbodiimide, with the olefinically unsaturated monocarboxylic acid and the resulting condensation intermediate is then poly added to the tetracarboxylic acid dianhydride. In the second, the tetraamino compound is first reacted with the tetracarboxylic acid dianhydride to produce a poly addition intermediate and then, the olefinically unsaturated monocarboxylic acid is condensed with the poly addition intermediate in the presence of carbodiimide.

If the polyimidazo pyrrolone precursors are produced according to the invention in such a manner that a tetraamino compound is reacted in the presence of carbodiimide with an olefinically unsaturated tetracarboxylic acid diester, the polycondensation intermediate formed in the process can advantageously be condensed further with an unsaturated monocarboxylic acid which is also performed in the presence of carbodiimide. Additional radiation-reactive groups thus can be introduced into the precursors which causes a further increase of the photoreactivity.

Further according to the invention, similar polyimidazo pyrrolone precursors with increased photoreactivity can also be prepared in such a manner that the tetraamino compound is first reacted, by means of carbodiimide, with an olefinically unsaturated monocarboxylic acid and the condensation intermediate formed in the process is subsequently polycondensed with an olefinically unsaturated tetracarboxylic acid diester, likewise in the presence of carbodiimide. Instead of the tetracarboxylic acid diester, a tetracarboxylic acid may also be used, but the precursors so obtained are then less radiation-reactive.

The method according to the invention is easy to practice, and in general, reaction temperatures from 0° to 50° C. are sufficient. Since no acid chlorides participate in the reaction, elaborate purification operations are eliminated. In addition, the reaction products including the urea derivatives generated as by-products are produced in a very pure state. It is surprising that according to the method of the invention, the reactions with the carbodiimides proceed substantially uniformly and completely, i.e., without secondary reactions. In particular, also, the urea derivatives can be separated readily from the precursors formed in the process.

The polymer precursors produced by the method according to the invention are particularly suitable for the preparation of structured highly heat-resistant protection and isolating layers in microelectronics (fine-structure generation) as well as a photoresist (cf. the simultaneously filed U.S. patent application "Method for Manufacturing Polyimidazole and Polyimidazopyrrolone Relief Structures", Siemens, VPA 84 P 3119 US).

The radiation-reactive precursors prepared in accordance with the invention have in general the following structures:

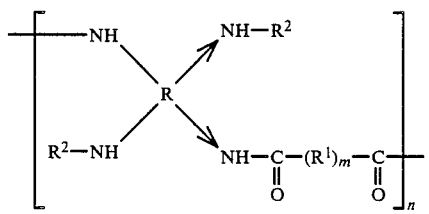

-continued

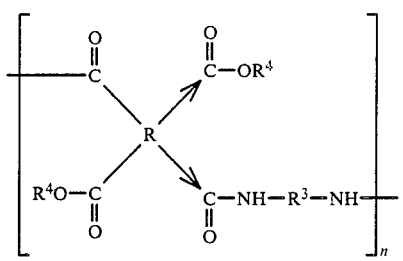

The arrows given in the formulas (the first formula stands for polyimidazole precursors and the second formula stands for polyimidazo pyrrolone precursors) indicate that the two substituents bonded to R by the arrows can interchange their positions. This is of importance because R is a cyclic radical, as will be further explained in the following text. In the formulas, n stands for an integral number from 2 to about 100, and m is 0 or 1. R, $R^1$, $R^2$, $R^3$, $R^4$ are defined as follows.

R is an at least partially aromatic and/or heterocyclic tetravalent, i.e., tetrafunctional radical or a halogenated derivative thereof in which two respective valences are arranged in mutually adjacent positions; if the radical R has several aromatic and/or heterocyclic structural elements, then the valence pairs are respectively located at such structure elements in end positions;

$R^1$ is a divalent, i.e., difunctional radical or a halogenated derivative thereof, with an aliphatic and/or cycloaliphatic structure which has optical hetero atoms, and/or an aromatic and/or heterocyclic structure.

$R^2$ is an olefinically unsaturated radical, for instance, an allyl ether-containing group, particularly an optionally substituted (meth)acrylic ester-containing group or a propargyl group.

$R^3$ is an at least partially aromatic and/or heterocyclic, divalent, i.e., difunctional radical, in which an amino group is arranged in adjacent position at least to one of the two valences.

If $R^3$ has several aromatic and/or heterocyclic structure elements then the free valences are respectively located at endposition structure elements of this type.

$R^4$ is hydrogen or $R^2$.

The radicals R, $R^1$, $R^2$, $R^3$, and $R^4$ have the following preferred definitions.

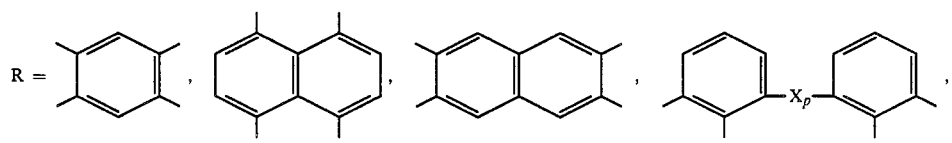

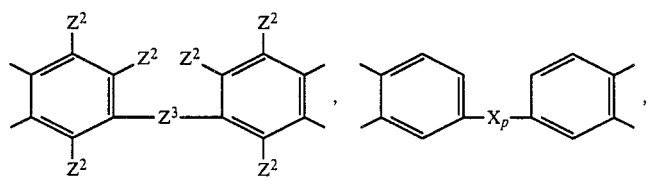

-continued
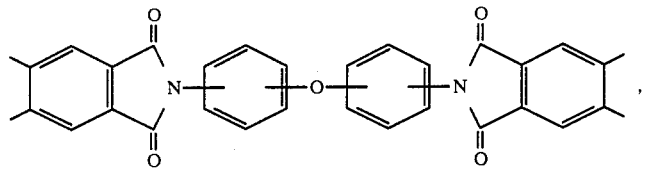
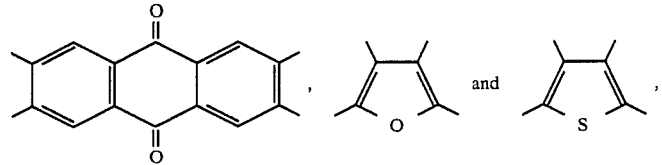
where p=0 or 1 and X stands for one of the following radicals.
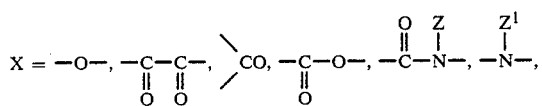
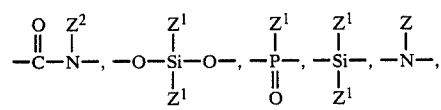
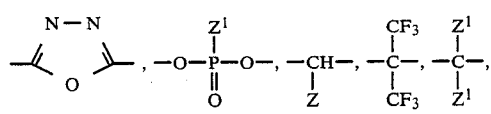
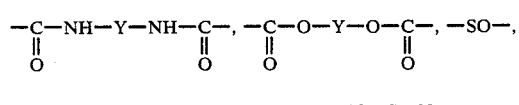
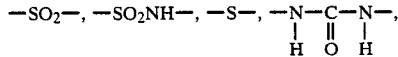
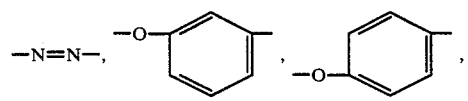
wherein
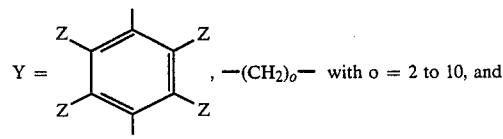
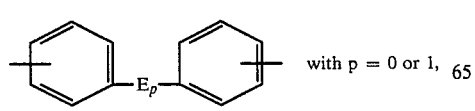
Z=H or alkyl with 1 to 6 carbon atoms
$Z^1$=alkyl with 1 to 10 carbon atoms or aryl, $Z^2$=aryl or heteroaryl, and
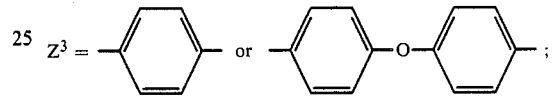
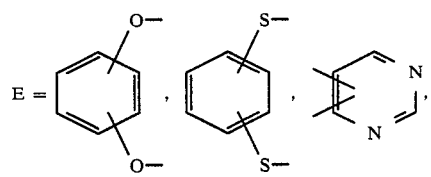
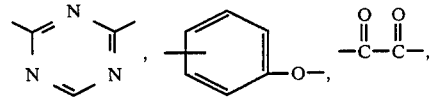
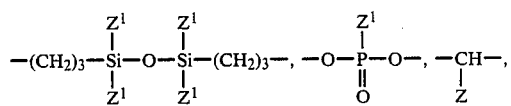
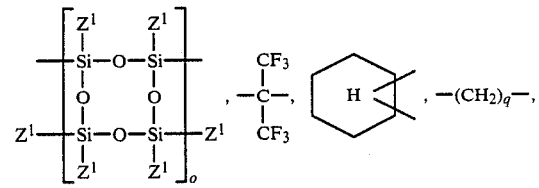
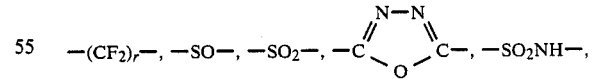
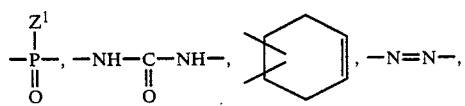
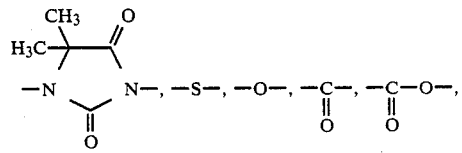
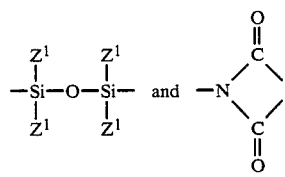

-continued
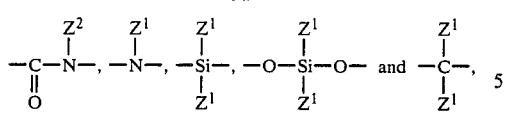
where o=2 to 10, q=2 to 14 and r=2 to 18, and $Z^1$ and $Z^2$ are defined as above.
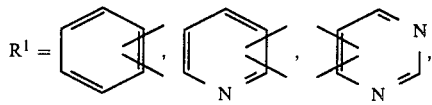
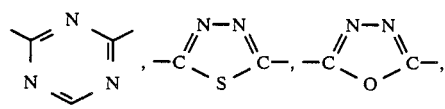
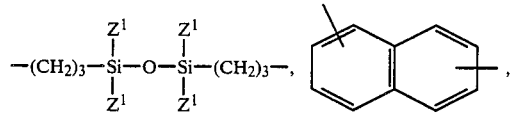
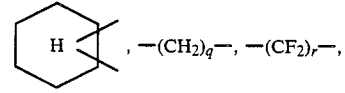
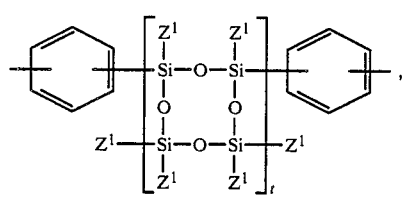
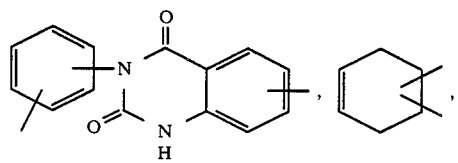
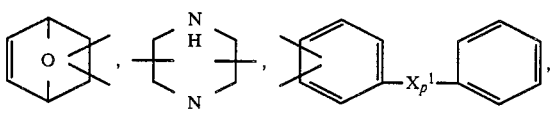
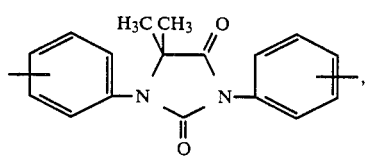
-continued
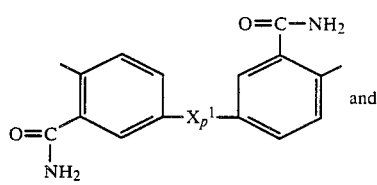
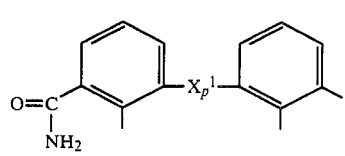
where p=0 or 1, q=2 to 14, r=2 to 18 and t=1 to 10, and $Z^1$ is defined as above.
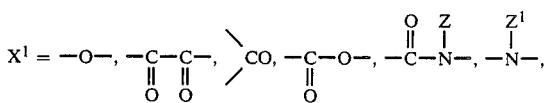
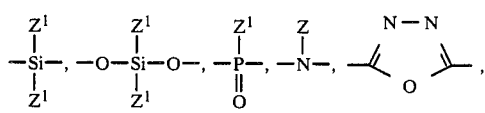
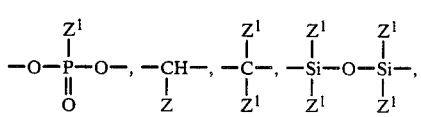
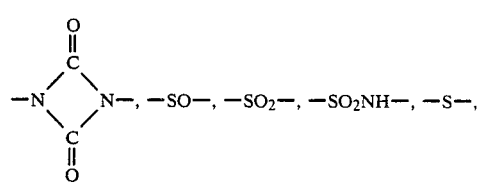
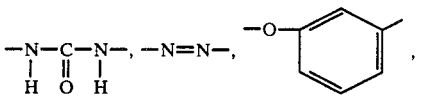
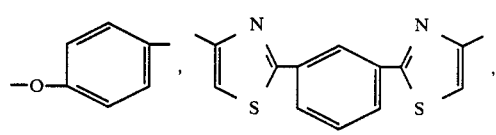
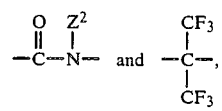
where Z, $Z^1$ and $Z^2$ are defined as above.
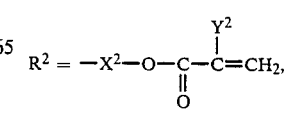

-continued

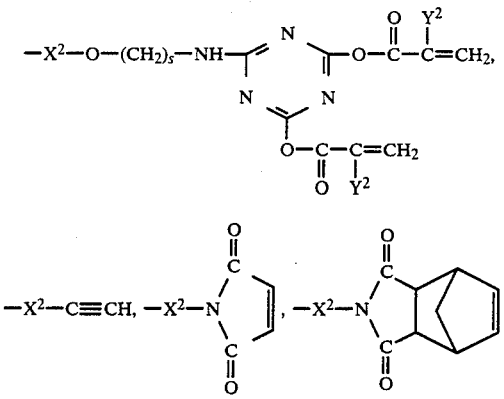

—X²—O—CH₂—CH=CH₂ and —X²—O—CH₂—C≡CH;

where s=2 to 16;
for the further radicals, the following applies:

$X^2 = -(CH_2)_r-$ and $-CH_2-O-[(CH_2)_r-O]_t-(CH_2)_s-$, and $Y^2 = -H, -CH_3, -Cl, -Br$ or $-C\equiv N$, where r=2 to 18, s=2 to 16, and t=1 to 10.

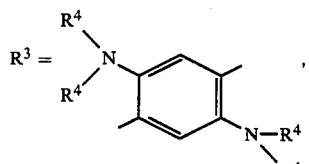

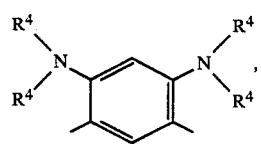

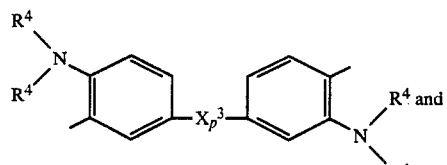

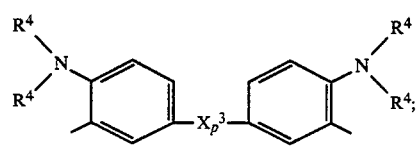

where p=0 or 1, and X³ has the meaning given above for X¹.

The radiation-reactive precursors produced by the method according to the invention are essentially polycondensation products of tetraamino compounds with dicarboxylic acids (polyimidazole precursors) or polyaddition products of the tetraamino compounds and tetracarboxylic acid dianhydrides and polycondensation products of the tetraamino compounds and tetracarboxylic acid diesters (polyimidazo pyrrolone precursors). Diamino benzidine is preferred here as the tetraamino compound. The preferably employed dicarboxylic acid is isophthalic acid and the preferred tetracarboxylic acid dianhydride is pyromellitic acid dianhydride. When olefinically unsaturated monocarboxylic acids are used in the method according to the invention, acrylic acid and methacrylic acid are preferred. Among the olefinically unsaturated alcohols used in the invention hydroxyethyl acrylate and hydroxyethyl methacrylae are preferred. The preferably used carbodiimide is dicyclohexyl carbodiimide; carbodiimides are compounds of the type R'—N=C=N—R''.

The precursors produced in accordance with the invention preferably have as building blocks aromatic amino compounds and therefore furnish in the thermal treatment polymers with the following structural units:

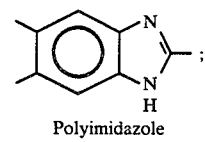
Polyimidazole

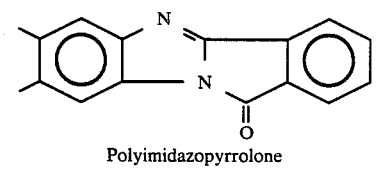
Polyimidazopyrrolone

In addition to the use as a photoresist and for the preparation of protection and isolation layers, where structuring takes place, the precursors according to the invention can also serve in general (unstructured form) for the manufacture of protection and insulation coatings.

The invention will now be illustrated by the following examples which are not meant to be limiting.

EXAMPLE 1

Preparation of a radiation-reactive polybenzimidazole precursor 21.4 parts by weight diaminobenzidine (0.1 mole) and 16 parts by weight methacrylic acid (0.19 mole) are dissolved in 70 parts by volume N-methylpyrrolidone. While being stirred and cooled down to 10° C., 42 parts by weight dicyclohexylcarbodiimide (0.2 mole) are then added dropwise to this solution in 100 parts by volume gamma-butyrolactone. After the addition is completed, the reaction solution is further allowed to stand for 3 hours at room temperature. Then, 16.6 parts by weight isophthalic acid (0.1 mole) are added to the reaction solution and subsequently, a solution of 42 parts by weight dicyclohexyl carbodiimide (0.2 mole) is dropwise added in 120 pats by volume gamma-butyrolactone while stirring and cooling to 8° C. In the process a viscous resin solution is soon formed which is allowed to stand for 18 hours at room temperature. Subsequently, the dicyclohexyl urea is filtered off and a clear resin solution is obtained. This resin solution is poured on aluminum sheet and dried at a pressure of 1.3×10⁴ Pa and a temperature of 40° C. In the process, homogeneous films are produced which are hardened in a few minutes upon exposure to a 350-W mercury extra-high pressure lamp, depending upon film thickness.

EXAMPLE 2

Preparation of a radiation-reactive polyimidazo pyrrolone precursor

To 21.8 parts by weight pyromellitic acid dianhydride (0.1 mole) in 50 parts by volume N-methylpyrrolidone are added 26 parts by weight hydroxyethyl methacrylate (0.2 mole) while stirring and under the exclusion of moisture. The reaction mixture is then allowed to stand for 20 hours at room temperature. The titrimetrically determined carboxyl content is 0.21 mole/100 g. A solution of 20.4 parts by weight diaminobenzidine (0.09 mole) in 70 parts by volume N-methylpyrrolidone is added to the reaction solution while stirring. Subsequently a solution of 42 parts by weight dicyclohexyl carbodiimide (0.2 mole) in 120 parts by volume gamma-butyrolactone is added dropwise to the solution cooled down to a temperature of 5° to 10° C. After the addition is completed, the viscous reaction solution is allowed to stand for 20 hours at room temperature and then freed by filtration of the precipitated dicyclohexyl urea. When adding the resin solution dropwise to distilled water while stirring, a yellow solid substance is precipitated which furnishes a yellow resin powder after drying at a temperature of 40° C. and a pressure of $1.3 \times 10^4$ Pa. In the IR spectrum, the absorptions at 950 and 1630 $cm^{-1}$, typical for methacrylates, are present.

What is claimed is:

1. A method for manufacturing an oligomeric, polymeric or a mixture of an oligomeric and polymeric radiation-reactive precursor or a polyimidazo-pyrrolone, comprising reacting in the presence of a carbodiimide, an aromatic, heterocyclic or a mixture of an aromatic and a heterocyclic tetraamino compound with an olefinically unsaturated monocarboxylic acid and an aromatic, heterocyclic or a mixture of an aromatic or heterocyclic tetracarboxylic acid dianhydride or an olefinically unsaturated tetracarboxylic acid diester in the form of an addition product of said tetracarboxylic acid dianhydride and an olefinically unsaturated alcohol.

2. A method for manufacturing a polyimidazo pyrrolone precursor according to claim 1, wherein the tetraamino compound is (a) reacted first with the olefinically unsaturated monocarboxylic acid in the presence of carbodiimide to produce a condensation intermediate which is poly added to the tetracarboxylic acid dianhydride or (b) reacted first with the tetracarboxylic acid dianhydride to produce a polyaddition intermediate which is condensed with the olefinically unsaturated monocarboxylic acid in the presence of carbodiimide.

3. A method for manufacturing a polyimidazo pyrrolone precursor according to claim 1 wherein a polycondensation intermediate is formed by reaction of the tetraamino compound with the olefinically unsaturated tetracarboxylic acid diester, and an olefinically unsaturated monocarboxylic acid is condensed with the polycondensation intermediate in the presence of carbodiimide.

4. A method according to claim 1 wherein pyromellitic acid anhydride is the tetracarboxylic acid dianhydride.

5. A method according to claim 1 wherein hydroxyethyl acrylate or hydroxyethyl methacrylate is the olefinically unsaturated alcohol.

* * * * *